United States Patent
Gall et al.

(10) Patent No.: US 7,570,492 B2
(45) Date of Patent: Aug. 4, 2009

(54) APPARATUS FOR VENTING AN ELECTRONIC CONTROL MODULE

(75) Inventors: Thomas P. Gall, Northbrook, IL (US); Michael Pfeifer, Northbrook, IL (US); Anthony Polak, Lake Zurich, IL (US); Michael J. Pomeroy, New Braunfels, TX (US)

(73) Assignee: Temic Automotive of North America, Inc., Deer Park, IL (US)

( * ) Notice: Subject to any disclaimer, the term of this patent is extended or adjusted under 35 U.S.C. 154(b) by 659 days.

(21) Appl. No.: 10/801,515

(22) Filed: Mar. 16, 2004

(65) Prior Publication Data

US 2005/0207114 A1  Sep. 22, 2005

(51) Int. Cl.
H05K 7/02 (2006.01)
H05K 7/06 (2006.01)
H05K 7/08 (2006.01)
H05K 7/10 (2006.01)

(52) U.S. Cl. ........................... 361/760; 361/700
(58) Field of Classification Search .......... 436/147, 436/367; 361/700–704, 760
See application file for complete search history.

(56) References Cited

U.S. PATENT DOCUMENTS

| 6,130,098 | A | * | 10/2000 | Handique et al. ............ 436/180 |
| 6,247,450 | B1 | | 6/2001 | Jiang .......................... 123/446 |
| 6,327,144 | B1 | | 12/2001 | May |
| 6,350,949 | B1 | | 2/2002 | Boyd ......................... 174/50.5 |
| 6,357,414 | B1 | * | 3/2002 | Kalinowski et al. ....... 123/198 E |
| 6,486,398 | B1 | | 11/2002 | McCulloch et al. ........ 174/52.3 |
| 2003/0216119 | A1 | | 11/2003 | Mashiko et al. |

FOREIGN PATENT DOCUMENTS

| JP | 4-048677 | 4/1992 |
| JP | 10-098288 | 4/1998 |
| JP | 2001-024348 | 1/2001 |
| JP | 2001-219362 | 8/2001 |
| JP | 2003-336874 | 11/2003 |

* cited by examiner

*Primary Examiner*—Tuan T Dinh

(57) ABSTRACT

An electronic control module comprising a vent assembly is provided. The electronic control module comprises a housing having a first aperture and a substrate disposed within the housing. The substrate has a second aperture positioned adjacent to the first aperture, and includes the hydrophobic vent assembly disposed over the second aperture and adheringly coupled to the substrate. The hydrophobic vent assembly may be adapted to prevent the ingress of moisture and permit the egress of certain gases.

9 Claims, 4 Drawing Sheets

APPARATUS FOR VENTING AN ELECTRONIC CONTROL MODULE

FIELD OF THE INVENTION

The present technique relates to venting of electronic control modules. More particularly, the present technique relates to the venting of an electronic module via a vent assembly coupled to a printed circuit board.

BACKGROUND INFORMATION

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

As automobile and engine technology advance, the control systems utilized have become increasingly complex. To achieve compliance with stricter emissions and fuel economy standards, for example, many engines include electronic control modules. Typically, electronic control modules comprise closed-loop control circuits that monitor operating conditions and adjust various operating parameters in response to the monitored conditions. For example, a control module may receive data from various sensors located throughout the system and, in response, adjust any number of operating parameters of the system under control. Such dynamic adjusting typically causes the controlled system, such as an engine, to operate in a more desirable manner.

Electronic control modules typically include a number of electronic components physically and electrically coupled to a substrate, such as a printed circuit board. Because of the generally sensitive nature of the electronic components, coupled with the fact that the components may be subject to harsh environments, control modules have traditionally been placed within protective housings. The housings generally are configured to prevent ingress of contaminants, particularly moisture.

Unfortunately, the electronic components of the modules generate heat during operation and, resultantly, may induce an increase in the pressure and temperature of the ambient air disposed within the protective housing. Heated and pressurized air, if not relieved from the housing, may negatively affect the performance of the control module and may even damage the electronic components as well as the printed circuit board. Thus, the desire to prevent ingress of contaminants, particularly moisture, may be incongruous with the desire to allow egress of the pressurized and heated internal air.

Accordingly, many electronic control modules have been equipped with vent assemblies that allow egress of pressurized and heated air while simultaneously preventing ingress of moisture. Typically, these vent assemblies comprise a waterproof, yet not air tight, membrane disposed within rubber grommet that extends through holes in the housing and printed circuit board. When installed, the rubber grommet creates a watertight mechanical seal by tightly engaging with portions of the printed circuit board and housing.

As a mechanical seal, however, the rubber grommet may be susceptible to loss of sealing engagement induced by vibrations or movements naturally found in operating environments, such as automobiles. In other words, repetitive movements within the automobile may cause the vent assembly to loosen from the housing, thereby weakening the sealing engagement and allowing ingress of contaminants, particularly moisture, between the housing and grommet assembly.

Furthermore, traditional rubber grommet vent assemblies may require dedication of a relatively large surface area on the circuit board. Generally, a printed circuit board is more cost effective if a larger portion of its surface area can be devoted to electronic circuitry rather than a mechanical sealing system. Moreover, because of the rubber or insulative composition of the grommet, it may electrically isolate the electronic components of the circuit board from circuit ground. For example, the components on top of the circuit board may require a path to circuit ground that extends to the opposite side of the board. A rubber grommet, however, may prevent such a path, and, as such, an additional via (e.g., hole) may be necessary. This additional via occupies valuable surface area leading to an increase in the cost of the module.

Additionally, installation of the rubber grommet assembly generally occurs after the various electronic components have been attached to the printed circuit board. Accordingly, good adherence to dimensioning on the circuit board may be necessary, leading to longer manufacture times and greater expenses. Moreover, installation of the grommet vent assembly may require a dedicated device solely employed for such installation. A dedicated device adds an additional expense with respect to manufacture and usurps already precious floor space at the manufacturing facility.

BRIEF DESCRIPTION OF THE DRAWINGS

Advantages of the invention may become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

According to one embodiment of the present technique, a novel vent assembly is provided. The vent assembly permits egress of heated air disposed within an electronic control module and, concurrently, prevents ingress of contaminants, particularly moisture, into the electronic control module. The vent assembly may be adheringly coupled to a substrate, such as a printed circuit board. Advantageously, again according to an exemplary embodiment of the present technique, the amount of substrate surface area occupied by the vent assembly may be reduced in comparison to traditional vent assemblies. Moreover, manufacture times and productions costs may also be reduced in comparison to traditional vent assemblies.

Figure 1:
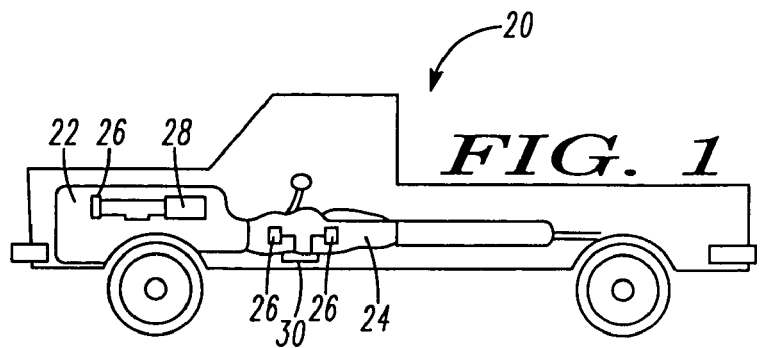
FIG. 1 represents an exemplary vehicle with an engine and transmission each having an electronic control module.

Referring initially to FIG. 1, an exemplary vehicle 20, which for the purposes of explanation is an automobile, is illustrated. Although the technique is presently discussed in relation to an automobile, it is worth note that the present technique may be applied to any number of different modalities. For example, the present technique may be applied to other types of vehicles, such as heavy equipment, marine craft, or airplanes, as well as to non-vehicles, such as generator sets. Returning to the presently discussed automobile, it comprises an engine 22 and a transmission 24 that work in conjunction with other components to provide motive force.

To improve operation of the vehicle, it may be advantageous to dynamically adjust certain systems and operating parameters in light of sensed operating conditions of the vehicle. By way of example, disposed throughout the vehicle 20 and particularly concentrated in proximity to the engine 22 and transmission 24 may be a plurality of sensors 26 configured to collect data regarding a variety of operating conditions. For example, the sensors 26 may include an oxygen sensor for detecting air/fuel ratios, a temperature sensor for monitoring operating temperatures, and/or an emissions sensor for detecting emission gases produced during operation. The data, once obtained by the various sensors 26, may then be transmitted to the appropriate electronic control module or modules for processing. In the exemplary automobile, the electronic control modules are represented by an engine control module 28 as well as a transmission control module 30. Although only two types of control modules are presently described for exemplary purposes, those of ordinary skill in the art will appreciate that control modules may be configured to accommodate any number of functions and operations and that modern vehicles typically contain at least one, and often several, electronic control modules, including antilock braking systems, stability control systems, traction control systems, and power convenience controls.

As mentioned above, the engine control module 28 and the transmission control module 30 receive data from the various sensors 26 and, in response, adjust the appropriate operating parameters of the vehicle 20. The engine control module 28 and/or transmission control module 30 may be integrated into a closed-loop system that dynamically manipulates various operating parameters of the vehicle 20 to achieve optimum or desired operation of the engine, transmission, and/or other vehicle systems. For example, the engine control module 28 may adjust the air/fuel ratio of an engine cylinder in response to input from the oxygen sensor, emission sensor, or other sensors to improve the efficiency of the engine.

It is worth reiterating that the use of the present technique in an automotive setting is just but one exemplary use. Indeed, the present technique, as described with respect to the exemplary engine control module 28, may be applied to any number of sealed electronic circuits, such as circuits used in underwater applications, the petroleum industry, the packaging industry, and many other applications in which egress of air and ingress of contaminants are concerns.

Figure 2:
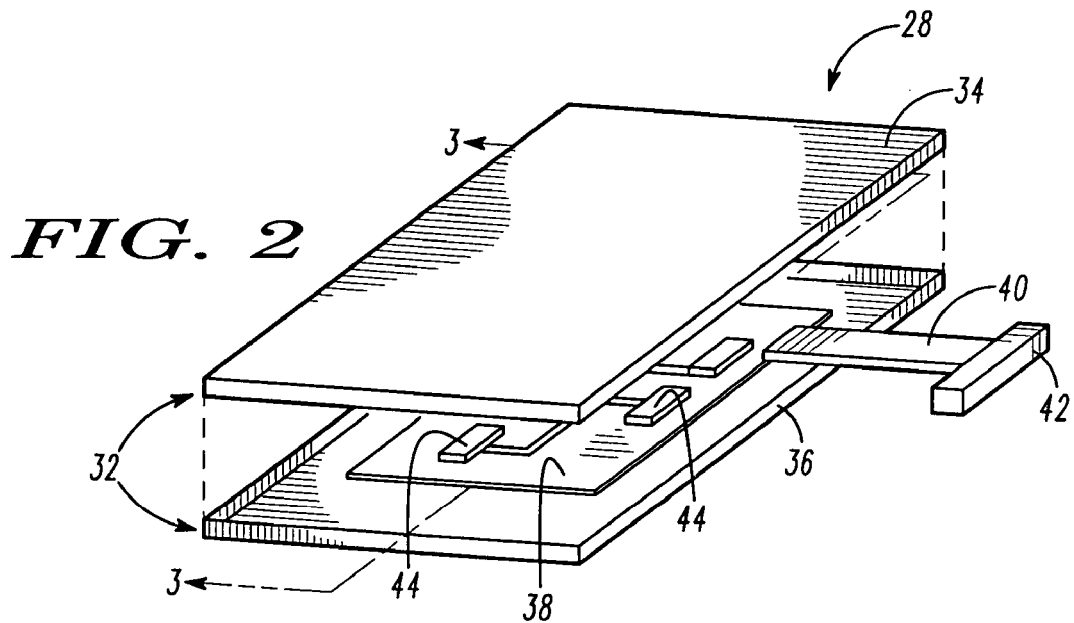
FIG. 2 is an exploded view of an exemplary electronic control module, the figure depicting a printed circuit board disposed within a housing.

Turning next to FIG. 2, this figure affords a view of certain internal components of the exemplary engine control module 28 introduced above. It is worth note that a number of internal features generally disposed within the module 28 have been excluded for the ease of explanation. However, an artisan of ordinary skill appreciates these features as well as the relationship of these features to the module.

Because the engine's 22 compartment may be a harsh environment for the internal components of the module (e.g., printed circuit board and its components), the engine control module 28 advantageously may comprise a housing 32 formed of a rigid, corrosion-resistant material, such as aluminum. However, those of ordinary skill in the art will appreciate that other suitable materials may also be used. For example, galvanized steel or plastic may also provide a good balance between the demands for corrosion resistance, structural integrity, and cost effectiveness. The illustrated housing 32 comprises an upper portion 34 and a lower portion 36 which may be securely fastened together by suitable fastening mechanisms, such as screws, latches, adhesives, etc.

Additionally, the control module 28 includes a printed circuit board 38 disposed between the housing portions 34 and 36. As discussed above, the printed circuit board includes circuits to facilitate the analysis of any number of sensed operating conditions and provide response signals to control the various automotive systems, for example. The input and output of these signals between the circuit board and the appropriate automotive systems may be conducted over a cable 40, such as the illustrated ribbon cable. The relatively thin and flexible profile of the ribbon cable 40 provides a number of connection options to the circuit board 38. Indeed, the ribbon cable 40 may conform to the confines of the vehicle's engine compartment 20 (FIG. 1). Additionally, disposed on the unsecured end of the cable 40 may be a connector 42 configured to provide a connection mechanism to various vehicle systems, such as the engine 22 or transmission 24 (FIG. 1). That is, the connector 48 may be configured to mate with a part (not shown) on the appropriate vehicle system. Although a ribbon cable 40 is presented in the exemplary embodiment, any suitable cable, connector, and/or connection assembly may be used. Indeed, those of ordinary skill in the art appreciate that a wide variety of connections and cable types may be employed.

Focusing on the printed circuit board 38, the board 38 may include a plurality of electronic components 44, such as microprocessors and other integrated circuit chips, electrically and physically coupled thereto. As discussed previously, these components 44, as well as the printed circuit board 38 itself, may be susceptible to damage if exposed to contaminants, particularly water or moisture. Accordingly, the assembled housing 32 may be sealed to prevent (or at least significantly retard) ingress of moisture. Because the housing 32 may be formed of two separate pieces, it may be advantageous to provide a seal at the mated junction of the pieces to prevent the unwanted ingress of contaminants. Accordingly, disposed between the upper and lower portions 34 and 36 may be a flexible seal, such as an Gring (not shown). By sealing the housing 32 as such, ingress of water and other containments may be prevented.

Figure 3:
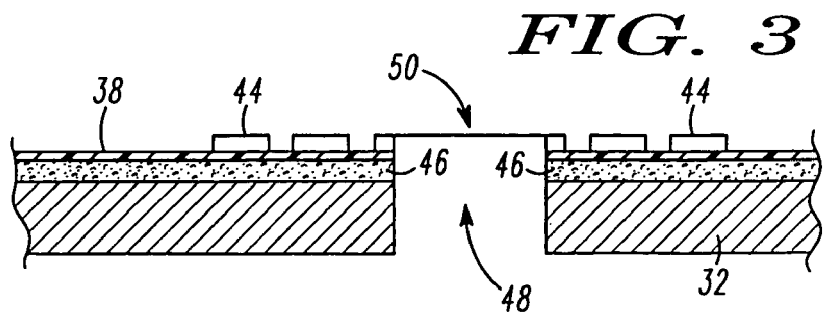
FIG. 3 is a partial cross-sectional view of the electronic control module of FIG. 2 along line 3-3 illustrating an exemplary vent assembly in accordance with one embodiment of the present technique.

Turing next to FIG. 3, various strata of an exemplary control module 28 are illustrated. The bottom stratum (with respect to the orientation of the instant figures) represents the lower portion 36 of the housing 32. In this example, by coupling the printed circuit board 38 to the housing 32 by an adhesive 46, the rigid nature of the aluminum housing 32 provides structural support to the printed circuit board 38. The adhesive 46 may be a pressure-sensitive adhesive that activates (i.e., becomes sticky) upon compression of the printed circuit board 38 against the housing 32. Additionally, the aluminum housing 32 may serve as a heat sink for the printed circuit board 38. Indeed, the efficient dissipation of excess heat from the printed circuit board 38 may significantly improve performance of the module 28. Moreover, as further discussed below, a path to circuit ground for the board 38 (including the components 44 thereon) may be provided by the aluminum housing 32.

Although it is important to seal the housing 32 to prevent water and other contaminants from reaching the circuitry, it is also important to facilitate the egress of heated and pressurized air. As discussed above, the components 44 generate heat during operation and, as such, cause the air disposed within the housing 32 to expand and pressurize. Pressurized and heated air, when trapped in the housing 32, may negatively impact the performance of the module. Advantageously, a vent assembly, exemplary embodiments of which are discussed below, may provide for egress of such air while concurrently preventing ingress of contaminants, such as moisture.

Extending through the exemplary strata 32, 38, and 46 may be a series of aligned apertures which in conjunction with one another form a vent hole 48. The vent hole 48 provides a flow path for egress of heated and pressurized air from the housing 32. To prevent the vent hole 48 from also allowing the ingress of unwanted contaminants, such as moisture, a vent assembly 50 configured to permit egress of gasses and concurrently prevent ingress of moisture may be disposed across the vent hole 48.

Figure 4:
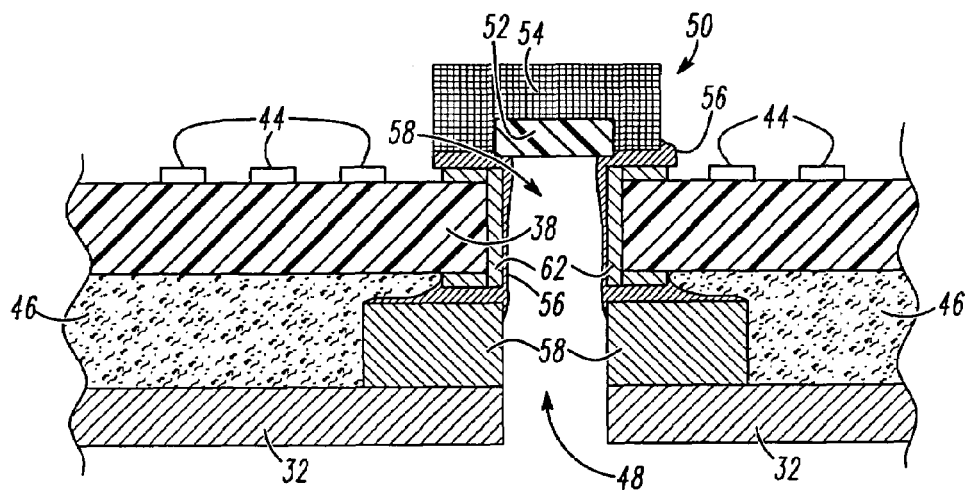
FIG. 4 is a detail view of the strata and vent assembly as introduced in FIG. 3.

Referring to FIG. 4, a detail view of the strata 32, 38 and 46, as well as the vent assembly 50 introduced in FIG. 3 is provided. The vent assembly 50 comprises a hydrophobic membrane 52 secured to a structural screen 54. An exemplary hydrophobic membrane material is GORE-TEX® (GORE-TEX® is a registered trademark of W. L. Gore, Inc.) available from W. L. Gore, Inc., of Newark, Del. However, other fluorinated polymer membranes are also envisaged. Advantageously, the hydrophobic membrane 52 permits egress of air from the housing and, concurrently, prevents ingress of moisture. For structural support, the membrane 52 may be adhesively or mechanically secured to a structural screen 54, such as a 180-mesh copper screen.

The vent assembly 50 may be adheringly secured to the printed circuit board 38 by solder 56. That is, in contrast to the mechanical engagement of the previously described rubber grommet vent assemblies, the vent assembly 50 is bonded to the printed circuit board 38. By adheringly securing the vent assembly 50 to printed circuit board 38, the total surface area of the printed circuit board 38 occupied by the vent assembly 50 may be significantly reduced in comparison to traditional methods, such as rubber grommets. For example, the surface area on the board dedicated to venting may be reduced from 150 mm$^2$, generally required by traditional grommet assemblies, to 5 mm$^2$. Moreover, the deletion of the relatively expensive rubber grommets employed to secure traditional vent assemblies also leads to a comparative reduction in cost of manufacture, in the range of 10-25 cents per module. Furthermore, manufacture time may be reduced by 80% by adheringly coupling the vent assembly 50 to the printed circuit board 38.

In operation, water or moisture that enters into the vent hole 48 of this embodiment meets with the impermeable profile of the vent hole 48 and vent assembly 50. More particularly, moisture which enters the vent hole 48 is unable to enter the electronic control module 28 because of the water-proof nature of the hydrophobic membrane 52, the solder 56, ground dots 55, and the aluminum housing 32. Furthermore, due to the relatively small diameter of the vent hole 48, the surface tension of the water droplets themselves may also prevent ingress of moisture into the housing 32. Advantageously, the pressurized air expelled from the control module during operation, as well as the small diameter of the vent hole 48, prevent contaminants, such as dirt, from clogging the vent hole 48.

In the illustrated embodiment, an electrical pathway to circuit ground (eg., the aluminum housing) may extend from the board 38 and the components 44 on the board, through a via 60 on the circuit board 38 to the housing 32. The exemplary pathway to circuit ground also includes a ground coupling 62 disposed about the via 60 of the board 38. The ground coupling 62 may comprise an electrically conductive film, such as a copper film, disposed about the perimeter of the via 60. In other words, the ground coupling 62 may be a copper film disposed over a portion of both sides of circuit board 38 as well as the circumferential perimeter of the via 60. In the illustrated embodiment, the ground coupling 62 facilitates the electrical pathway to circuit ground by electrically coupling the electrical components 44 disposed on the surface of the printed circuit board 38 to the ground dot 58. The pathway may also include solder 56 which both mechanically and electrically couples the ground coupling 62 to the ground dot 58. Because of the difficulty in soldering to aluminum, the ground dot 58, by directly abutting against the aluminum housing 32, advantageously provides a solderable base for coupling to the housing 32.

In operation, the electrical components 44 of the illustrated embodiment are coupled to circuit ground by the electrical pathway that extends from the circuit board 38 to the ground coupling 62, into the solder 56, through the ground dot 58 and lastly into the aluminum housing 32 which, in turn, is coupled to circuit ground. By coupling to circuit ground through the via 60 and vent hole 48, an additional via through the circuit board 38 specifically for coupling the components to circuit ground is unnecessary. This, in turn, conserves precious surface area on the printed circuit board 38 which may be used for additional electrical components 44, thereby facilitating the manufacture of a desired circuit board in a more cost-effective manner.

Figure 5:
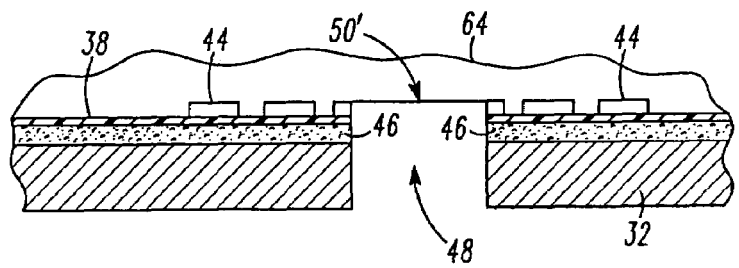
FIG. 5 is a partial cross-sectional view of the electronic control module of FIG. 2 along line 3-3, FIG. 4 illustrating an exemplary vent assembly in accordance with an alternate embodiment of the present technique.
Figure 6:
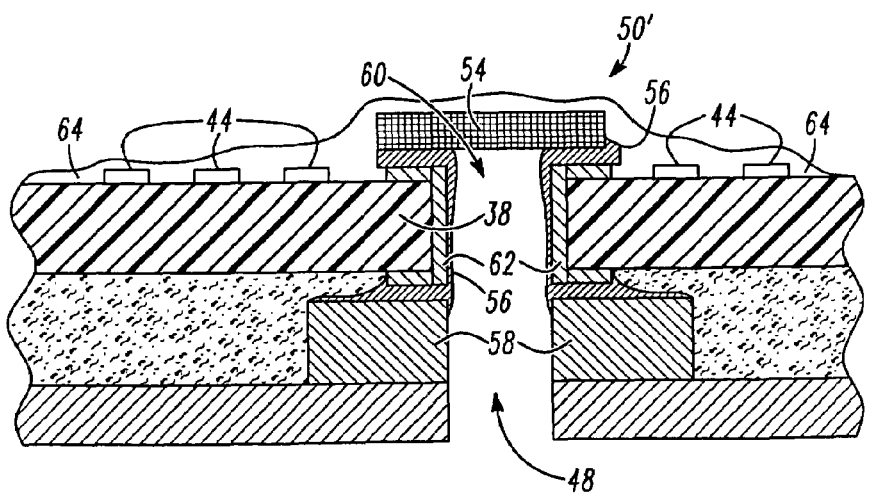
FIG. 6 is a detail view of the strata and vent assembly introduced in FIG. 5.

Focusing on an alternative embodiment for the vent assembly 50', as depicted in FIGS. 5 and 6, this vent assembly 50' comprises a conformal coating 64 disposed over the structural screen 54. For example, the vent assembly 50' may comprise a 180-mesh copper screen 64 having a protective, hydrophobic conformal coating 52, such as Wacker Semicosil® 964 (available from Wacker-Chemie GmbH of Munich, Germany), disposed thereover. Upon application of the conformal coating 64, the structural screen 54 becomes hydrophobic and, as such, prevents ingress of moisture. Advantageously, the conformal coating 64 may also provide a dielectric coating to the components 44.

The conformal coating 64 of the exemplary embodiment tents over the openings in the structural screen 54 but will not hold air pressure. Accordingly, under pressure, the conformal coating 64 forms flaps and permits egress of the pressurized and heated air, however, the coating 64 remains impermeable to moisture, thereby preventing ingress of contaminants particularly moisture. Similar to the embodiment illustrated in FIGS. 3 and 4, the structural screen 54, and, as such, the assembly 50' illustrated in FIG. 6, may be adheringly secured to the printed circuit board 38 via the solder 56. Again, by adheringly securing the vent assembly 50' to printed circuit board 38, the total surface area of the printed circuit board 38 occupied by the vent assembly 50' may be significantly reduced in comparison to traditional vent assemblies.

Figure 7:
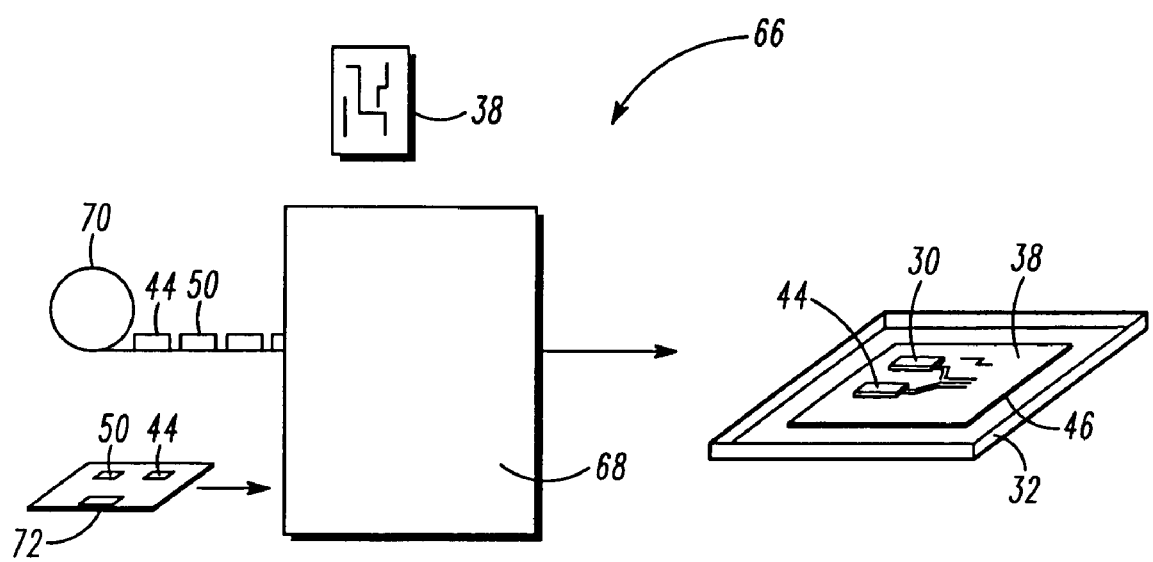
FIG. 7 is a representation of an exemplary system for manufacture of an electronic control module, the system comprising an exemplary pick-and-place device having tape reel and tray feeds.

Turning next to FIG. 7, an exemplary system 66 for the manufacture of a vent assembly, such as, for example, the vent assemblies 50 and 50' set forth in the foregoing embodiments, is illustrated. The system 66 comprises a pick-and-place device 68, which may be used to place components 44 onto the printed circuit board 38. The exemplary pick-and-place device 68 may be a computer-controlled and automated system that receives components 44 from feeders 70 and 72 and places the components 44 at the appropriate positions on the printed circuit board 38. In other words, the pick-and-place device 68 picks a plurality of components 44 off of a component source, such as the tape reel 70 or tray 72, and places these components 44 onto the printed circuit board 38. Advantageously, pick-and-place machines, such as the device 68, may reduce the manufacture time of printed circuit boards by upwards of 80%, thereby reducing the cost of manufacture. Those of ordinary skill in the art will appreciate the availability of pick-and-place devices and the operation thereof. Indeed, pick-and-place devices are available from, for example, Fuji America Corporation of San Jose, Calif.

With reference to the vent assemblies 50 (FIGS. 3-6) of the present embodiments, these assemblies 50 may be installed onto the printed circuit board 38 by the pick-and place-device 68 in a fashion similar to the installation of the components 44. In this example, a tape reel 70 or tray 72 having a plurality of vent assemblies 50 disposed thereon may be fed into the pick-and-place device 68. During assembly of the circuit board 38, the pick-and-place device 68 receives the vent assemblies 50 by way of either the tape reel 70 or tray 72, and positions each assembly 50 onto a respective printed circuit board 38 at the appropriate location. Advantageously, the vent assembly 50 may be placed onto each printed circuit board 38 in an operation concurrent with the assembly of the remaining components 44 onto the printed circuit board 38. As such, the efficiency of manufacture may be increased by upwards of 80%, and the cost of manufacture may be decreased by 10 to 25 cents per electronic control module. Furthermore, by placing the vent assemblies 50 onto the respective printed circuit boards 38 with the pick-and-place device 68, an additional machine dedicated to the insertion of a traditional rubber grommet vent is not necessary. Resultantly, relatively precious floor space in a manufacturing facility is conserved, and, as such, the cost of manufacture may be further reduced.

As discussed further below, the board 38 may be coupled to the appropriate housing portion 32. As illustrated, the board 38 may be secured to the housing 32 by an adhesive 46 (FIGS. 4 and 6). Once the components 44 are appropriately placed onto the printed circuit board 38, the components 44 may then be secured to the board 38 by a re-flow soldering process, which is commonly known to those of ordinary skill in the art.

Figure 8:
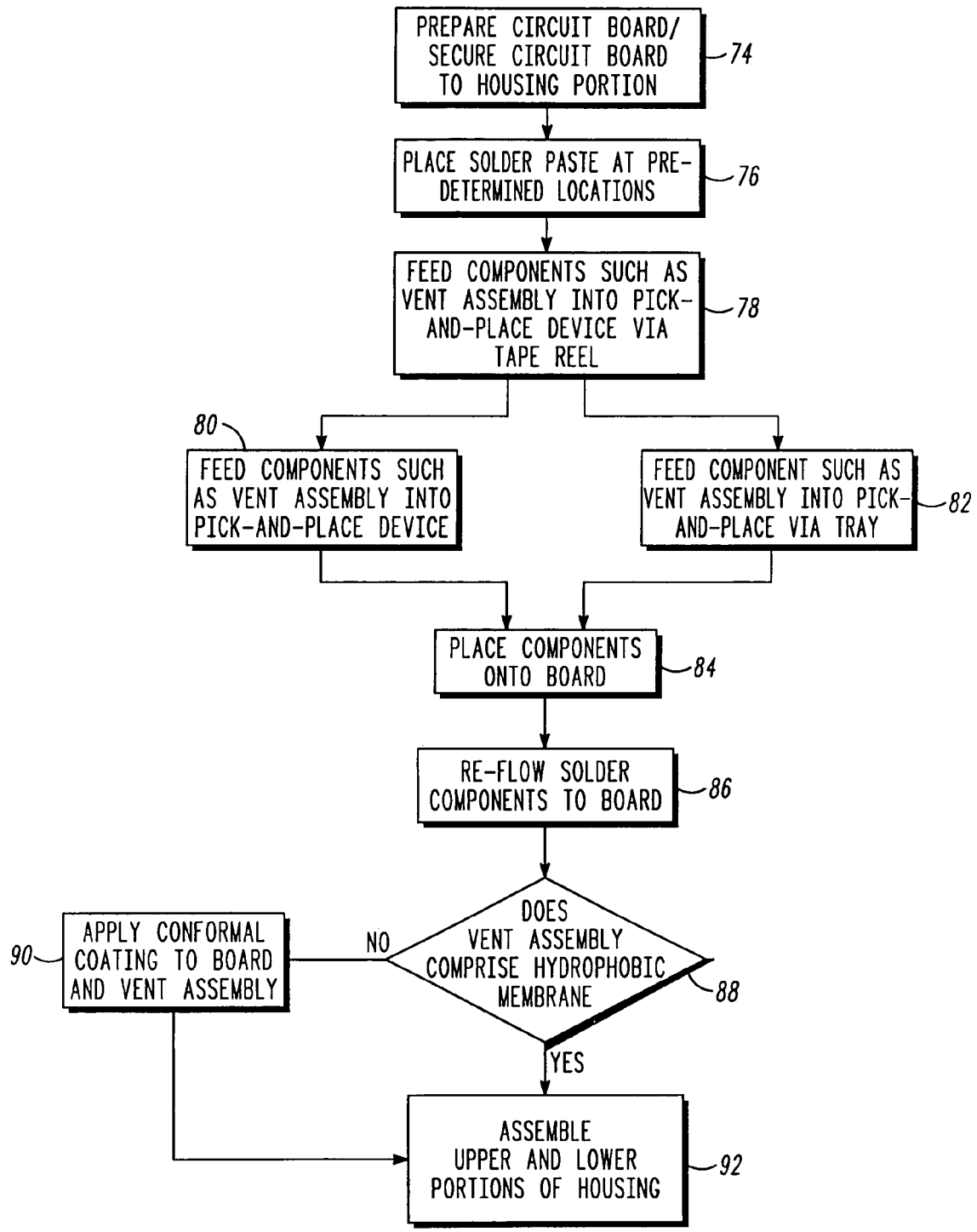
FIG. 8 is a flow chart illustrating stages in an exemplary process for the manufacture of an electronic control module.

Keeping FIG. 7 in mind, FIG. 8 is a flow chart representing exemplary steps of a process for manufacturing an electronic control module in accordance with embodiments discussed above. One step, represented by block 74, comprises preparing a circuit design onto a printed circuit board, and coupling the board to the appropriate housing portion 32. Another step in the exemplary method, represented as block 76, comprises placing a solder paste at various component locations on the unassembled printed circuit board 38. Those of ordinary skill in the art appreciate that solder paste may be applied by way of any number of procedures, such as applying the solder paste via a syringe-like tool at the various predetermined component locations. Yet another exemplary step, as represented by block 78, comprises feeding the unassembled printed circuit boards 38 into the pick-and-place 68 device.

In the process, one of two exemplary paths may be followed. Along one path, as represented by block 80, components 44, such as the vent assembly 50, may be fed into the pick-and-place device 68 via a tape reel 70. In the alternative, along a second path, as represented by block 82, the components 44, including the vent assembly 50, may be fed to the pick-and-place device 68 via a tray 72. In either event, once the components 44 have been fed into the pick-and-place device 68, the device 68 may place the respective components 44 onto various pre-pasted solder and predetermined component 44 locations, this step of the process is represented by block 84.

In the exemplary process, as represented by block 86, the components 44 may be secured to the printed circuit board 38 via a re-flow soldering process. During an exemplary re-flow soldering process, the solder paste already sandwiched between the components 44 and the printed circuit board 38 is heated. This heat melts the solder paste and securely solders the components 44, including the vent assembly 50, to the printed circuit board 38. To heat the solder paste, the entire printed circuit board 38, including the components 44 and vent assembly 50, may be subject to a heat intensity appropriate to melt the solder paste. Accordingly, to reduce reflow temperatures, a lead-based solder may be used. Advantageously, lead-based solders reach reflow conditions at relatively low temperatures. Those of ordinary skill in the art appreciate the process of re-flow soldering and the requirements thereof.

As represented by block 88, a conformal coating may be applied to the printed circuit board 38 and, as such, the vent assembly 50. For example, if the vent assembly 50 comprises a hydrophobic membrane, then it may be redundant to apply a conformal coating 64 (FIGS. 5 and 6) to the vent assembly 50 and circuit board 38. Accordingly, in the interest of being efficient and cost effective, it may be advantageous to forgo the application of a conformal coating. However, again for example, if no such membrane is present in the vent assembly 50, then it may be advantageous to apply a hydrophobic conformal coating 64 to the printed circuit board 38, as illustrated by block 90, thereby coating the components 44, including the vent assembly 50.

In either event, as represented by block 92, the housing may be assembled. The portions 34 (FIG. 2) of the housing 32 may be securely fastened to the lower portion 36 by any number of known fastening techniques. To ensure sealing between the portions 34 and 36, a flexible seal (not shown), such as an O-ring, may be disposed between the two portions prior to formal assembly. Once assembled, the module, particularly the vent assembly 50, then provides sealing against ingress of moisture while, simultaneously, permitting egress of gasses.

While the invention may be susceptible to various modifications and alternative forms, specific embodiments have been shown by way of example in the drawings and have been described in detail herein. However, it should be understood that the invention is not intended to be limited to the particular forms disclosed. For example, as stated above, the present invention may be employed in any number of modalities such as airplanes, marine craft or generator sets. Rather, the invention is to cover all modifications, equivalents, and alternatives falling within the spirit and scope of the invention as defined by the following appended claims.

What is claimed is:

1. An electronic control module, comprising:
   a housing having a first aperture; and
   a substrate disposed within the housing and having a second aperture positioned adjacent to the first aperture, and including a hydrophobic vent assembly disposed over the second aperture and adheringly coupled to the substrate, and adapted to permit egress with respect to the housing of a gas therethrough,
   wherein at least one electrical component located on the substrate electrically couples to ground via an electrical pathway extending through the second aperture, the electrical pathway being electrically coupled to the housing.

2. The module as recited in claim 1, wherein the hydrophobic vent assembly comprises a fluorinated polymer membrane coupled to a structural screen.

3. The module as recited in claim 1, wherein the hydrophobic vent assembly is adheringly coupled to the substrate via solder.

4. The module as recited in claim 2, wherein the fluorinated polymer membrane comprises GORE-TEX®.

5. The module as recited in claim 2, wherein the structural screen is a 180-mesh copper soldered to the substrate.

6. An electronic control module, comprising:
   a housing having a first aperture; and
   a substrate disposed within the housing and having a second aperture positioned adjacent to the first aperture, and including a hydrophobic vent assembly disposed over the second aperture and adheringly coupled to the substrate, and adapted to permit egress with respect to the housing of a gas therethrough,
   wherein the hydrophobic vent assembly comprises a hydrophobic coating disposed over a structural screen, wherein the structural screen is coupled to the substrate.

7. The module as recited in claim 6, wherein the hydrophobic coating comprises Wacker Semicosil 964®.

8. The module as recited in claim 6, wherein the hydrophobic vent assembly is adheringly coupled to the substrate via solder.

9. The module as recited in claim 6, wherein the structural screen is a 180-mesh copper soldered to the substrate.

* * * * *